United States Patent
Shabbir et al.

(10) Patent No.: US 10,254,807 B2
(45) Date of Patent: Apr. 9, 2019

(54) SYSTEMS AND METHODS FOR POLICY-BASED PER-ZONE AIR MOVER MANAGEMENT FOR OFFLINE MANAGEMENT CONTROLLER

(71) Applicant: Dell Products L.P., Round Rock, TX (US)

(72) Inventors: Hasnain Shabbir, Round Rock, TX (US); Timothy M. Lambert, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 341 days.

(21) Appl. No.: 15/180,976

(22) Filed: Jun. 13, 2016

(65) Prior Publication Data

US 2017/0357299 A1 Dec. 14, 2017

(51) Int. Cl.
*G05B 15/02* (2006.01)
*G06F 1/20* (2006.01)
*H05K 7/20* (2006.01)

(52) U.S. Cl.
CPC ......... *G06F 1/206* (2013.01); *H05K 7/20836* (2013.01)

(58) Field of Classification Search
CPC .............................. G06F 1/206; G05B 15/02
See application file for complete search history.

(56) References Cited

U.S. PATENT DOCUMENTS

| 6,932,696 | B2* | 8/2005 | Schwartz | G06F 1/20 361/695 |
| 7,621,460 | B2* | 11/2009 | Dorr | G06F 1/184 236/49.3 |
| 2003/0126473 | A1* | 7/2003 | Maciorowski | G06F 11/2033 713/300 |
| 2004/0027799 | A1* | 2/2004 | King | G06F 1/206 361/679.48 |
| 2005/0049729 | A1* | 3/2005 | Culbert | G06F 1/206 700/50 |
| 2012/0116590 | A1* | 5/2012 | Florez-Larrahondo | G06F 1/206 700/275 |
| 2013/0176680 | A1* | 7/2013 | Lovicott | G06F 1/206 361/679.48 |

* cited by examiner

*Primary Examiner* — Mark A Connolly
(74) *Attorney, Agent, or Firm* — Jackson Walker L.L.P.

(57) ABSTRACT

In accordance with embodiments of the present disclosure, a management controller for use in an information handling system may include a processor configured to manage a plurality of air mover control systems for a plurality of air movers integral to the information handling system, each air mover of the plurality of air movers associated with a corresponding zone of the information handling system and a co-processor configured to, in the event of a fault condition of the processor, manage the plurality of air mover control systems in accordance with a per-zone policy.

21 Claims, 3 Drawing Sheets

SYSTEMS AND METHODS FOR POLICY-BASED PER-ZONE AIR MOVER MANAGEMENT FOR OFFLINE MANAGEMENT CONTROLLER

TECHNICAL FIELD

The present disclosure relates in general to information handling systems, and more particularly to controlling speed of an air mover during boot of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

Temperature control in an information handling system with air movers often involves use of open-loop and/or closed-loop feedback systems to control speed of an air mover and thus, the amount of air driven by air movers. Oftentimes, control of air movers is performed by a management controller of an information handling system. However, in some instances, a management controller (or portions thereof) may crash or otherwise go offline, rendering them unable to perform air mover control. Existing solutions to managing air mover control in the event of a management controller fault have numerous disadvantages.

SUMMARY

In accordance with the teachings of the present disclosure, the disadvantages and problems associated with controlling an air mover speed in response to a fault of a management controller may be substantially reduced or eliminated.

In accordance with embodiments of the present disclosure, a management controller for use in an information handling system may include a processor configured to manage a plurality of air mover control systems for a plurality of air movers integral to the information handling system, each air mover of the plurality of air movers associated with a corresponding zone of the information handling system and a co-processor configured to, in the event of a fault condition of the processor, manage the plurality of air mover control systems in accordance with a per-zone policy.

In accordance with these and other embodiments of the present disclosure, an information handling system may include a plurality of air movers for cooling information handling resources of the information handling system, each air mover of the plurality of air movers associated with a corresponding zone of the information handling system and a management controller communicatively coupled to the plurality of air movers. The management controller may include a processor configured to manage a plurality of air mover control systems for the plurality of air movers and a co-processor configured to, in the event of a fault condition of the processor, manage the plurality of air mover control systems in accordance with a per-zone policy.

In accordance with these and other embodiments of the present disclosure, a method may include detecting an event of a fault condition of a processor of a management controller for use in an information handling system comprising, wherein the processor is configured to manage a plurality of air mover control systems for a plurality of air movers integral to the information handling system, each air mover of the plurality of air movers associated with a corresponding zone of the information handling system and managing, by a coprocessor communicatively coupled to the processor, the plurality of air mover control systems in accordance with a per-zone policy in the event of the fault condition of the processor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
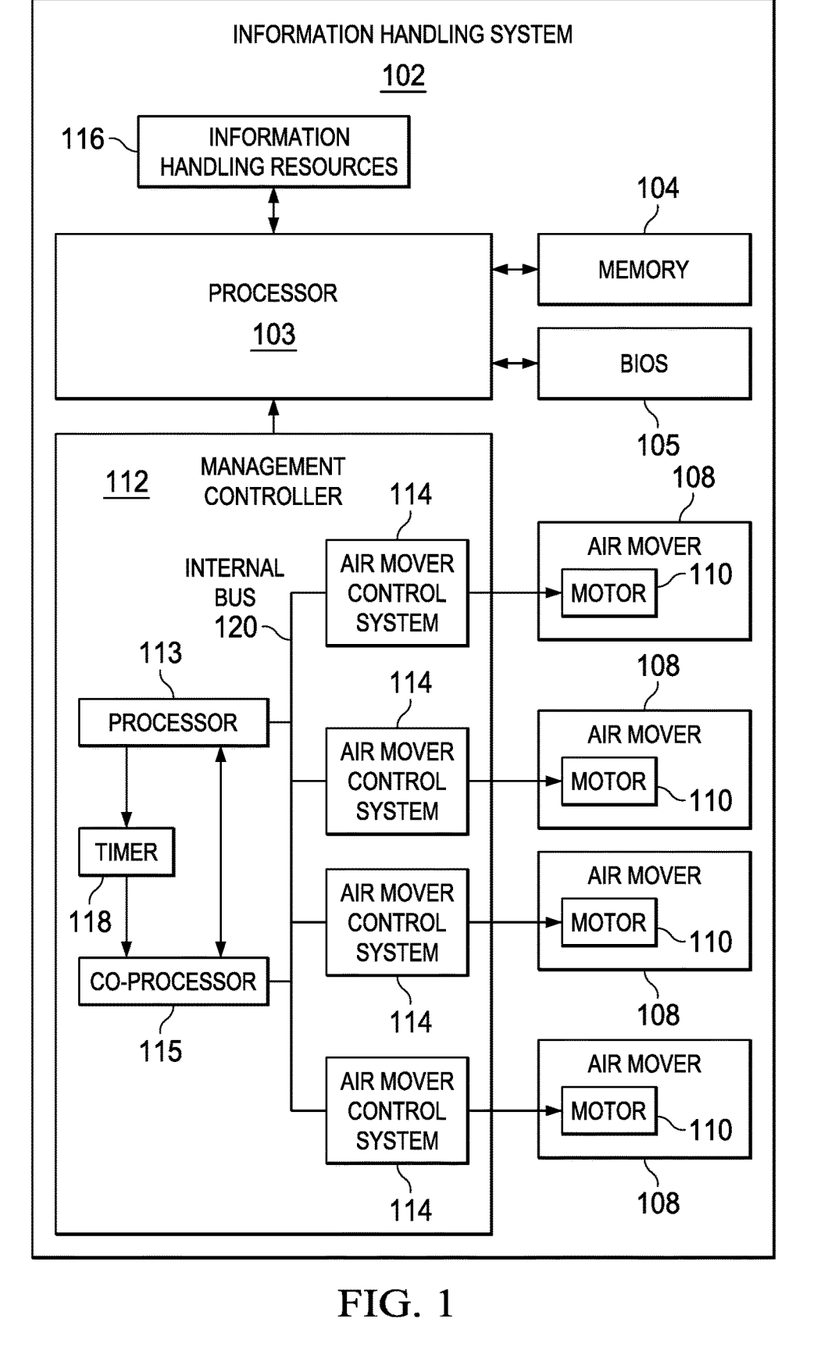
FIG. 1 illustrates a block diagram of selected components of an example information handling system, in accordance with embodiments of the present disclosure.
Figure 2:
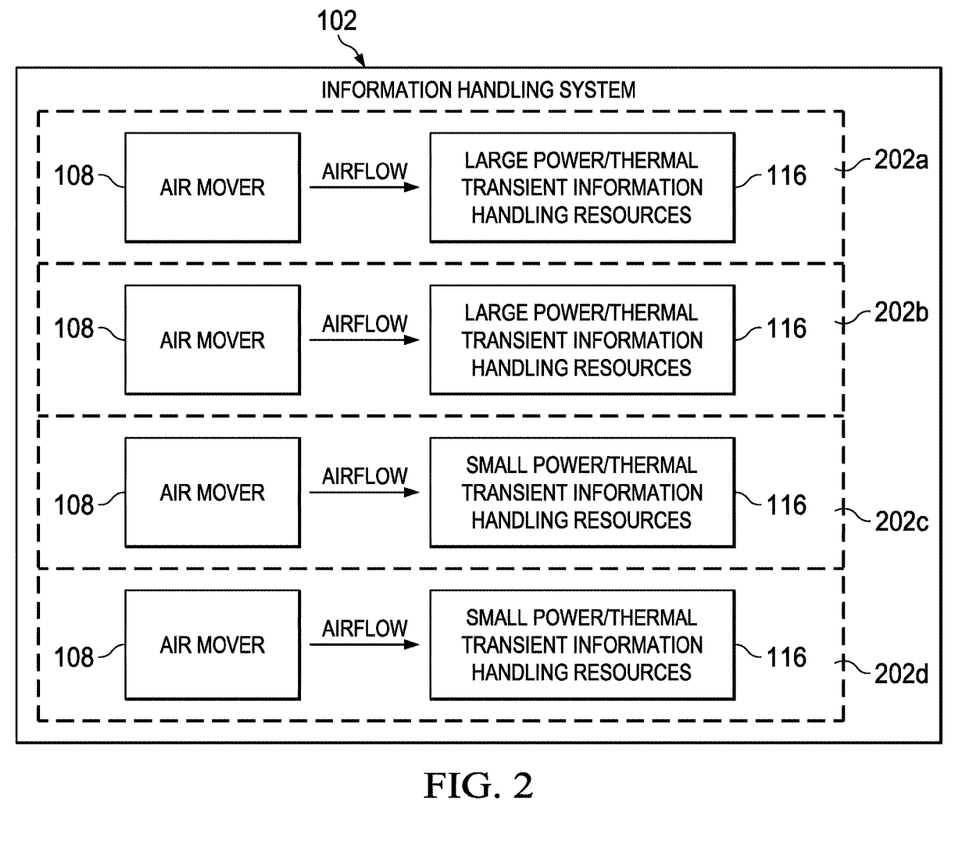
FIG. 2 illustrates another example block diagram of selected components of the example information handling system of FIG. 1, in accordance with embodiments of the present disclosure.
Figure 3:
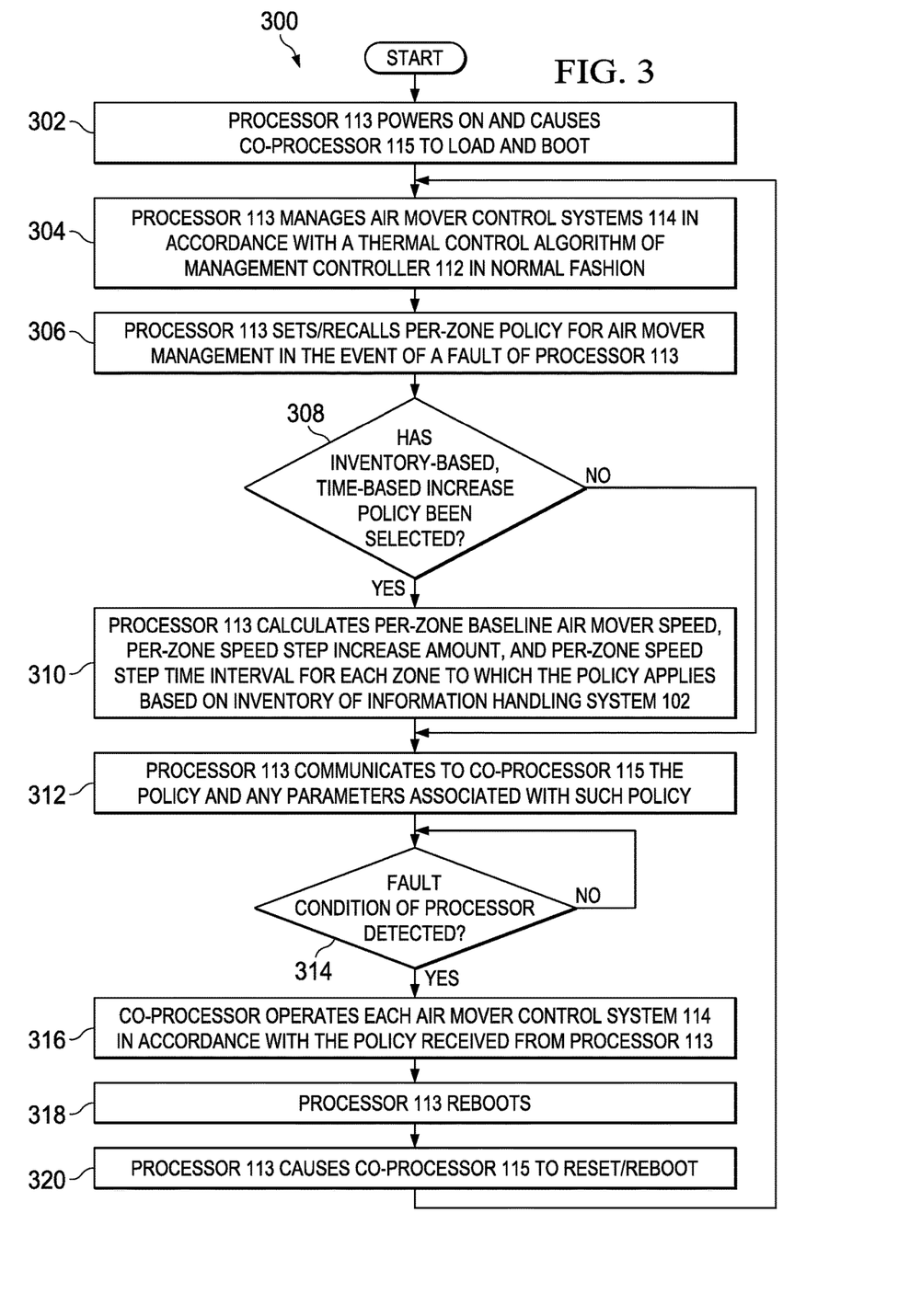
FIG. 3 illustrates a flow chart of an example method for controlling air mover speed during a fault of a management controller, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of selected components of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may comprise a processor 103, a memory 104, a basic input/output system (BIOS) 105, a plurality of air movers 108, and a management controller 112.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

A BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102. In some embodiments, BIOS 105 may also be configured to store and/or report configuration information regarding a hardware configuration (e.g., population of various information handling resources) of information handling system 102.

An air mover 108 may include any mechanical or electro-mechanical system, apparatus, or device operable to move air and/or other gases in order to cool information handling resources of information handling system 102. In some embodiments, an air mover 108 may comprise a fan (e.g., a rotating arrangement of vanes or blades which act on the air). In other embodiments, air mover 108 may comprise a blower (e.g., centrifugal fan that employs rotating impellers to accelerate air received at its intake and change the direction of the airflow). In these and other embodiments, rotating and other moving components of an air mover 108 may be driven by a motor 110. The rotational speed of a motor 110 may be controlled by an air mover control signal (e.g., a pulse-width modulation signal) communicated from a corresponding air mover control system 114 of management controller 112. In operation, an air mover 108 may cool information handling resources of information handling system 102 by drawing cool air into an enclosure housing the information handling resources from outside the enclosure, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a processor 113, a co-processor 115, a timer 118, a plurality of air mover control systems 114, and an internal bus 120.

Processor 113 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 113 may interpret and/or execute program instructions and/or process data stored in memory 104 and/or another component of information handling system 102 or management controller 112.

Co-processor 115 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, co-processor 115 may comprise a specialized and/or limited function processor capable of undertaking policy-based per-zone air mover management in the event of a fault of processor 113 of management controller 112, as described in greater detail elsewhere herein.

A timer 118 may include any system, device, or apparatus configured to detect a fault condition of processor 113 in response to failure to receive, for a predetermined period of time, an indication from processor 113 of an absence of a fault condition of processor 113. Examples of a fault condition of processor 113 are that an operating system (e.g., LINUX) executing on processor 113 has crashed, hung, or is otherwise not operating correctly, such that it fails to send an indication to timer 118 of the absence of a fault. If the predetermined period of time passes without the indication of the absence of a fault being received by timer 118, timer 118 may communicate an indication to co-processor 115 that a fault has occurred.

An air mover control system 114 may include any system, device, or apparatus configured to, based on information communicated from processor 113 (e.g., information regarding a hardware configuration of information handling system 102) and/or thermal conditions present in information handling system 102 (e.g., one or more sensed temperatures), calculate an air mover driving signal (e.g., a pulse-width modulation signal) to maintain an appropriate level of cooling, increase cooling, or decrease cooling, as appropriate, and communicate such air mover driving signal to a corresponding air mover 108. In some embodiments, an air mover control system 114 may include a program of instructions (e.g., software, firmware) configured to, when executed by a processor or controller integral to management controller 112, carry out the functionality of an air mover control system 114.

Internal bus 120 may be a signal bus internal to management controller 112 communicatively coupling air mover control systems 114 to processor 113 and co-processor 115, to allow communication of control signals from either or both of processor 113 and co-processor 115 to air mover control systems 114, as described in greater detail herein.

In addition to processor 103, memory 104, BIOS 105, air mover 108, and management controller 112, information handling system 102 may include one or more other information handling resources. In addition, for the sake of clarity and exposition of the present disclosure, FIG. 1 depicts four air movers 108 and four air mover controller air mover control systems 114. In embodiments of the present disclosure, information handling system 102 may include any number of air movers 108 and/or air mover control systems 114.

FIG. 2 illustrates another example block diagram of selected components of example information handling system 102, in accordance with embodiments of the present disclosure. As shown in FIG. 2, information handling system 102 may effectively include a plurality of cooling zones 202 (e.g., 202a, 202b, 202c, 202d). In some embodiments, such as the embodiments represented by FIG. 2, each zone 202 may be associated with a respective air mover 108. In other embodiments, a zone 202 may be associated with a plurality of air movers 108. In yet other embodiments, multiple zones 202 may be associated with a single air mover 108. As shown in FIG. 2, each zone 202 may include information handling resources 116 having different power needs and thermal properties. For example, some zones 202 (e.g., 202a, 202b) may include components such as one or more general-purpose graphics processing units (GPGPUs) which may have large power transient workloads and/or large thermal transient workloads (e.g., workloads that cause many instantaneous changes in the amount of power consumed and heat generated) while other zones 202 (e.g., 202c, 202d) may include components with components that do not often experience large power transient workloads and/or large thermal transient workloads.

In operation, management controller 112 may be configured to continue air mover management in a policy-based per-zone manner in the event of a fault of processor 113 of management controller 112. For example, when timer 118 indicates that a fault condition exists within processor 113, co-processor 115 may be configured to, based on a policy set by a user, manage air mover control systems 114. Example policies that may be set by a user are discussed below.

In a first policy, which may be referred to as a "maximum speed" policy, co-processor 115 may be configured to, in the event of a fault condition of processor 113, manage air mover control systems 114 to cause them to generate air mover control signals associated with the maximum speeds of air movers 108. In some embodiments, such policy may be set on a per-zone basis by the user, such that the policy applies to some zones 202 but not all. The table below illustrates an example application of the maximum speed policy to all zones 202.

| Zone | Speed before fault | Speed during fault | Speed after fault recovery |
|---|---|---|---|
| 202a | a % | 100% | Updated |
| 202b | b % | 100% | Updated |
| 202c | c % | 100% | Updated |
| 202d | d % | 100% | Updated |

As shown in the above table, prior to a fault condition of processor 113, air movers 108 of zones 202a, 202b, 202c, and 202d may have been operating at speeds of a %, b %, c %, and d %, in accordance with a thermal control algorithm of management controller 112. Upon occurrence of the fault condition in processor 113, co-processor 115 may take over air mover management, and cause all air mover speeds to increase to their maximum levels during the duration of the fault condition. After the fault condition has been remedied (e.g., processor 113 has rebooted and initialized to a point in which it is again able to perform thermal control), processor 113 may update all air mover speeds in accordance with the thermal control algorithm of management controller 112.

In a second policy, which may be referred to as a "ride-through" policy, co-processor 115 may be configured to, in the event of a fault condition of processor 113, manage air mover control systems 114 to cause them to generate air mover control signals in accordance with the speeds of air movers 114 existing right before the occurrence of the fault condition. In some embodiments, such policy may be set on a per-zone basis by the user, such that the policy applies to some zones 202 but not all. The table below illustrates an example application of the ride-through policy to all zones 202.

| Zone | Speed before fault | Speed during fault | Speed after fault recovery |
|---|---|---|---|
| 202a | a % | a % | Updated |
| 202b | b % | b % | Updated |
| 202c | c % | c % | Updated |
| 202d | d % | d % | Updated |

As shown in the above table, prior to a fault condition of processor 113, air movers 108 of zones 202a, 202b, 202c, and 202d may have been operating at speeds of a %, b %, c %, and d %, in accordance with a thermal control algorithm of management controller 112. Upon occurrence of the fault condition in processor 113, co-processor 115 may take over air mover management, and cause all air movers 108 to maintain such speeds. After the fault condition has been remedied (e.g., processor 113 has rebooted and initialized to a point in which it is again able to perform thermal control), processor 113 may update all air mover speeds in accordance with the thermal control algorithm of management controller 112.

In a third policy, which may be referred to as a "hybrid" policy, co-processor 115 may be configured to, in the event of a fault condition of processor 113, manage air mover control systems 114 to cause them to generate air mover control signals in accordance with the maximum speed policy in one or more selected zones 202, and to generate air mover control signals in accordance with the ride-through policy in other zones 202. In some embodiments, the selection of zones 202 to which the maximum speed policy and the ride-through policy applies may be based on an inventory of information handling resources 116 that exist in such zone 202. Thus, the maximum speed policy may be applied to zones 202 (e.g., zones 202a and 202b) which include information handling resources with large power transient workloads and/or large thermal transient workloads (e.g., so as to ensure adequate cooling if such large transient workloads occur) while the ride-through policy may be applied to zones 202 (e.g., zones 202c and 202d) which include information handling resources without large power transient workloads and/or large thermal transient workloads (e.g., so as to ensure quieter operation and lower power consumption in zones that are not likely to need additional cooling beyond the ride-through speed). The table below illustrates an example application of the hybrid policy.

| Zone | Speed before fault | Speed during fault | Speed after fault recovery |
|---|---|---|---|
| 202a | a % | 100% | Updated |
| 202b | b % | 100% | Updated |
| 202c | c % | c % | Updated |
| 202d | d % | d % | Updated |

As shown in the above table, prior to a fault condition of processor 113, air movers 108 of zones 202a, 202b, 202c, and 202d may have been operating at speeds of a %, b %, c %, and d %, in accordance with a thermal control algorithm of management controller 112. Upon occurrence of the fault condition in processor 113, co-processor 115 may take over air mover management, and cause air movers 108 in zones 202a and 202b to operate at their maximum speeds, and air movers 108 in zones 202c and 202d to maintain their pre-fault speeds. After the fault condition has been remedied (e.g., processor 113 has rebooted and initialized to a point in which it is again able to perform thermal control), processor 113 may update all air mover speeds in accordance with the thermal control algorithm of management controller 112.

In a fourth policy, which may be referred to as an "inventory-based, time-based increase" policy, co-processor 115 may be configured to, in the event of a fault condition of processor 113, manage air mover control systems 114 in one or more selected zones to cause them to generate air mover control signals that define an inventory-based baseline air mover speed which increases over time as a fault condition of processor 113 continues, and manage air mover control systems in other zones 202 to generate air mover control signals in accordance with the ride-through policy. In some embodiments, the selection of zones 202 to which the inventory-based baseline and increasing speeds applies and to which the ride-through policy applies may be based on an inventory of information handling resources 116 that exist in such zone 202. Thus, in zones 202 (e.g., zones 202a and 202b) which include information handling resources with large power transient workloads and/or large thermal transient workloads, the inventory-based baseline and increasing speeds may be applied (e.g., so as to ensure adequate cooling if such large transient workloads occur) while the ride-through policy may be applied to zones 202 (e.g., zones 202c and 202d) which include information handling resources without large power transient workloads and/or large thermal transient workloads (e.g., so as to ensure quieter operation and lower power consumption in zones that are not likely to need additional cooling beyond the ride-through speed). The table below illustrates an example application of the inventory-based, time-based increase policy.

| Zone | Speed before fault | Speed during fault | Speed after fault recovery |
|---|---|---|---|
| 202a | a % | a' % and increasing | Updated |
| 202b | b % | b' % and increasing | Updated |
| 202c | c % | c % | Updated |
| 202d | d % | d % | Updated |

As shown in the above table, prior to a fault condition of processor 113, air movers 108 of zones 202a, 202b, 202c, and 202d may have been operating at speeds of a %, b %, c %, and d %, in accordance with a thermal control algorithm of management controller 112. Upon occurrence of the fault condition in processor 113, co-processor 115 may take over air mover management, and cause air movers 108 in zones 202c and 202d to maintain their pre-fault speeds. However, based on an inventory of information handling resources 116 present in zones 202a and 202b, co-processor 115 may apply initial inventory-based speeds a'% and b'% which increase over time as the fault condition remains. For example, in some embodiments, such increase may be a particular increase in speed (e.g., 5%) at particular defined intervals (e.g., every 10 seconds) until a maximum speed (e.g., 100%) is reached. After the fault condition has been remedied (e.g., processor 113 has rebooted and initialized to a point in which it is again able to perform thermal control), processor 113 may update all air mover speeds in accordance with the thermal control algorithm of management controller 112.

FIG. 3 illustrates a flow chart of an example method 300 for controlling air mover speed during a fault of a management controller, in accordance with embodiments of the present disclosure. According to one embodiment, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen.

At step 302, processor 113 may power on and cause co-processor 115 to load and boot. Processor 113 may also configure co-processor 115 such that co-processor 115 does not reset/reboot in the event of a reset/reboot of processor 113.

As step 304, processor 113 may manage air mover control systems 114 in accordance with a thermal control algorithm of management controller 112 in normal fashion.

At step 306, processor 113 may set or recall a per-zone policy for air mover management in the event of a fault of processor 113. For example, such policy may be set by an administrator or other user of information handling system 102 via a management interface to management controller 112.

At step 308, processor 113 may determine whether the inventory-based, time-based increase policy has been selected. If the inventory-based, time-based increase policy has been set by the user, method 300 may proceed to step 310. Otherwise, method 300 may proceed to step 312.

At step 310, in response to the inventory-based, time-based increase policy being set by the user, processor 113 may calculate the per-zone baseline air mover speed, the per-zone speed step increase amount, and the per-zone speed step time interval for each zone to which the policy applies. Such calculations may be made based on an inventory of information handling resources 116 received by processor 113 from BIOS 105 and/or processor 103.

At step 312, processor 113 may communicate to co-processor 115 (e.g., via an application programming interface of processor 113 and co-processor 115) the policy and any parameters (e.g., per-zone baseline air mover speed, the per-zone speed step increase amount, and the per-zone speed step time interval for each zone) associated with such policy.

At step 314, co-processor 115 may monitor for a fault condition of processor 113. Such fault condition may be indicated by timer 118 (e.g., if processor 113 fails to give an indication to timer 118 that processor 113 is online), receipt of a reset signal from processor 113, and/or any other suitable indication. If a fault condition is detected, method 300 may proceed to step 316. Otherwise, method 300 may remain at step 314 until a fault condition is detected.

At step 316, in response to a fault condition, co-processor 115 may operate each air mover control system 114 in accordance with the policy (including any relevant parameters) received from processor 113.

At step 318, processor 113 may reboot. At step 320, processor 113 may cause co-processor 115 to reset/reboot. After completion of step 320, method 300 may proceed again to step 304, and processor 113 may again assume management of air mover control systems 114.

Although FIG. 3 discloses a particular number of steps to be taken with respect to method 300, method 300 may be executed with greater or lesser steps than those depicted in FIG. 3. In addition, although FIG. 3 discloses a certain order of steps to be taken with respect to method 300, the steps comprising method 300 may be completed in any suitable order.

Method 300 may be implemented using information handling system 102 or any other system operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A management controller for use in an information handling system comprising:
    a processor configured to manage a plurality of air mover control systems for a plurality of air movers integral to the information handling system, each air mover of the plurality of air movers associated with a corresponding zone of the information handling system; and
    a co-processor configured to, in the event of a fault condition of the processor, manage the plurality of air mover control systems in accordance with a per-zone policy;
    wherein the per-zone policy defines for each zone an air mover speed for an air mover of the plurality of air movers integral to such zone, wherein the air mover speed is defined to have an initial baseline speed that is based on an inventory of information handling resources integral to the zone, and wherein the co-processor is configured to apply the initial baseline speed immediately after the event of the fault condition.

2. The management controller of claim 1, wherein the per-zone policy is set by a user of the information handling system.

3. The management controller of claim 1, wherein the co-processor is configured to cause the air mover speed to increase over time from the initial baseline speed for at least one zone.

4. The management controller of claim 3, wherein the co-processor is configured to cause the air mover speed for the at least one zone to increase over time until reaching 100%.

5. The management controller of claim 4, wherein after the air mover speed for the at least one zone reaches 100%, the co-processor is configured to cause the air mover speed for the at least one zone to remain at 100% until the fault condition is remedied.

6. The management controller of claim 3, wherein the co-processor is configured to cause the air mover speed to increase while the fault condition exists.

7. The management controller of claim 3, wherein the co-processor is configured to cause the air mover speed to increase in discrete steps and discrete time intervals while the fault condition exists.

8. An information handling system comprising:
    a plurality of air movers for cooling information handling resources of the information handling system, each air mover of the plurality of air movers associated with a corresponding zone of the information handling system; and
    a management controller communicatively coupled to the plurality of air movers, the management controller comprising:
        a processor configured to manage a plurality of air mover control systems for the plurality of air movers; and
        a co-processor configured to, in the event of a fault condition of the processor, manage the plurality of air mover control systems in accordance with a per-zone policy;
        wherein the per-zone policy defines for each zone an air mover speed for an air mover of the plurality of air movers integral to such zone, wherein the air mover speed is defined to have an initial baseline speed that is based on an inventory of information handling resources integral to the zone, and wherein the co-processor is configured to apply the initial baseline speed immediately after the event of the fault condition.

9. The information handling system of claim 8, wherein the per-zone policy is set by a user of the information handling system.

10. The information handling system of claim 8, wherein the co-processor is configured to cause the air mover speed to increase over time from the initial baseline speed for at least one zone.

11. The information handling system of claim 10, wherein the co-processor is configured to cause the air mover speed for the at least one zone to increase over time until reaching 100%.

12. The information handling system of claim 11, wherein after the air mover speed for the at least one zone reaches 100%, the co-processor is configured to cause the air mover speed for the at least one zone to remain at 100% until the fault condition is remedied.

13. The information handling system of claim 10, wherein the co-processor is configured to cause the air mover speed to increase while the fault condition exists.

14. The information handling system of claim 10, wherein the co-processor is configured to cause the air mover speed to increase in discrete steps and discrete time intervals while the fault condition exists.

15. A method comprising:
    detecting an event of a fault condition of a processor of a management controller for use in an information handling system comprising, wherein the processor is configured to manage a plurality of air mover control systems for a plurality of air movers integral to the information handling system, each air mover of the plurality of air movers associated with a corresponding zone of the information handling system; and
    managing, by a co-processor communicatively coupled to the processor, the plurality of air mover control systems in accordance with a per-zone policy in the event of the fault condition of the processors;
    wherein the per-zone policy defines for each zone an air mover speed for an air mover of the plurality of air movers integral to such zone, wherein the air mover speed is defined to have an initial baseline speed that is based on an inventory of information handling resources integral to the zone, and wherein the co-processor applies the initial baseline speed immediately after the event of the fault condition.

16. The method of claim 15, wherein the per-zone policy is set by a user of the information handling system.

17. The method of claim 15, wherein the co-processor causes the air mover speed to increase over time from the initial baseline speed for at least one zone.

18. The method of claim 17, wherein the co-processor causes the air mover speed for the at least one zone to increase over time until reaching 100%.

19. The method of claim 18, further comprising, after the air mover speed for the at least one zone reaches 100%, the co-processor causing the air mover speed for the at least one zone to remain at 100% until the fault condition is remedied.

20. The method of claim 17, further comprising causing, by the co-processor, the air mover speed to increase while the fault condition exists.

21. The method of claim 17, further comprising causing, by the co-processor, the air mover speed to increase in discrete steps and discrete time intervals while the fault condition exists.

* * * * *

UNITED STATES PATENT AND TRADEMARK OFFICE
CERTIFICATE OF CORRECTION

PATENT NO. : 10,254,807 B2
APPLICATION NO. : 15/180976
DATED : April 9, 2019
INVENTOR(S) : Shabbir et al.

Page 1 of 1

It is certified that error appears in the above-identified patent and that said Letters Patent is hereby corrected as shown below:

In the Claims

Column 12, Lines 40-60, (approx.) Please amend Claim 15 as follows:
15. A method comprising:
    detecting an event of a fault condition of a processor of a management controller for use in an information handling system comprising, wherein the processor is configured to manage a plurality of air mover control systems for a plurality of air movers integral to the information handling system, each air mover of the plurality of air movers associated with a corresponding zone of the information handling system; and
    managing, by a co-processor communicatively coupled to the processor, the plurality of air mover control systems in accordance with a per-zone policy in the event of the fault condition of the processor;
    wherein the per-zone policy defines for each zone an air mover speed for an air mover of the plurality of air movers integral to such zone, wherein the air mover speed is defined to have an initial baseline speed that is based on an inventory of information handling resources integral to the zone, and wherein the co-processor applies the initial baseline speed immediately after the event of the fault condition.

Signed and Sealed this
Fourth Day of February, 2020

Andrei Iancu
*Director of the United States Patent and Trademark Office*